(12) United States Patent
Julien et al.

(10) Patent No.: US 6,646,510 B2
(45) Date of Patent: Nov. 11, 2003

(54) METHOD OF ADJUSTING GAIN AND CURRENT CONSUMPTION OF A POWER AMPLIFIER CIRCUIT WHILE MAINTAINING LINEARITY

(75) Inventors: Marquis Christian Julien, Kinburn (CA); Walter Wayne, Ottawa (CA)

(73) Assignee: SiGe Semiconductor Inc., Ottawa (CA)

( * ) Notice: Subject to any disclaimer, the term of this patent is extended or adjusted under 35 U.S.C. 154(b) by 0 days.

(21) Appl. No.: 10/085,586

(22) Filed: Mar. 1, 2002

(65) Prior Publication Data

US 2003/0164735 A1 Sep. 4, 2003

(51) Int. Cl.$^7$ ............................... H03G 3/10; H03G 5/16
(52) U.S. Cl. .................... 330/284; 330/134; 330/133
(58) Field of Search ............................... 330/133, 134, 330/284

(56) References Cited

U.S. PATENT DOCUMENTS

| | | | |
|---|---|---|---|
| 4,540,953 A | * | 9/1985 | Togari et al. ............... 330/284 |
| 5,438,683 A | * | 8/1995 | Durtler et al. ............... 455/74 |
| 5,442,311 A | | 8/1995 | Trafton |
| 5,572,166 A | | 11/1996 | Gilbert |
| 5,640,691 A | * | 6/1997 | Davis et al. ............... 455/126 |
| 6,175,279 B1 | * | 1/2001 | Ciccarelli et al. ........... 330/296 |
| 6,362,690 B1 | * | 3/2002 | Tichauer ..................... 330/298 |

* cited by examiner

*Primary Examiner*—Patricia Nguyen
(74) *Attorney, Agent, or Firm*—Freedman & Associates

(57) ABSTRACT

The gain and current consumption of a power amplifier are adjusted while maintaining amplified output signal linearity. Where linearity and low power consumption are maintained for the amplifier by controllable shunting of an input signal amplitude and by providing a predetermined bias signal to the amplifier circuit in a precalibrated manner. A mapping circuit is disposed for receiving a control signal and for providing the predetermined bias signal to the amplifier circuit in the precalibrated manner. The mapping circuit is either internally provided within the same circuit as the power amplifier, or externally.

27 Claims, 5 Drawing Sheets

METHOD OF ADJUSTING GAIN AND CURRENT CONSUMPTION OF A POWER AMPLIFIER CIRCUIT WHILE MAINTAINING LINEARITY

FIELD OF THE INVENTION

The field of the invention relates power consumption of power amplifier circuits, and more specifically in the area of adjusting gain and current consumption of a power amplifier while maintaining amplified signal linearity.

BACKGROUND OF THE INVENTION

Power amplifiers are used for amplifying low intensity, low amplitude electrical signal in order to produce an amplified, higher power, and higher amplitude, electrical amplified output signal. Gain associated with power amplifier is defined as the ratio of the output power of the amplified output signal to the input power of the input signal, in dB. In terms of judging power amplifier performance under realistic operating conditions, an Adjacent Channel Power Ratio (ACPR) measurement is used. Prior to taking an ACPR measurement, a desired frequency channel is modulated using a digital modulation scheme, such as that set forth in adherence to the 802.11 b modulation standard. Power amplifier output power in an adjacent channel, with respect to the desired frequency channel, is measured, where the ACPR is a ratio of electrical power in a desired frequency channel compared to that in another adjacent channel, thus giving an indication of frequency spreading of the modulated input channel. If the ACPR is high then spectral regrowth occurs, where electrical power is injected in frequency bands adjacent to the modulated input channel.

Another useful measure of power amplifier performance deals with a measure of a linearity of the power amplifier response. Most amplifiers are used in the linear region, where operating the power amplifier in this region provides low distortion and low harmonics for the amplified signal. In this linear region, the output power is the sum of the input power and the gain. As input power increases, the output power will increase proportionally to the gain until it starts to compress. When the difference between the small signal gain and the actual gain is 1 dB. called the one dB compression point, or P1 dB, operating the power amplifier below this point will cause high distortion and harmonics on the amplified output signal. Therefore, most power amplifier systems are operated a few dB above this P1 dB point In prior art circuits, power amplifier gain control is provided by one of two techniques, where in the first technique an amplitude of an input signal is fixed while a bias signal used to control a bias point for each amplifying stage is adjusted to provide a desired gain, or in the second technique the bias point for each amplifying stage is fixed with a fixed bias signal and the input signal is varied in amplitude instead of varying the gain. Both of these techniques providing a same amplitude output signal, however, they both have their limitations. The second technique is rarely used at radio frequency (RF), frequencies. In either the first or the second technique one of the input signals applied to the power amplifier is fixed and the other is variable.

Unfortunately both techniques have their disadvantages when used in power amplification purposes. The disadvantage of the first technique is that since the input signal is fixed in amplitude, varying the bias signal past a certain point will distort the output signal because the amplifying stages within the power amplifier are working within a non-linear region, operating close to the P1 dB point. Where in RF applications ACPR will occur as a result when using this technique.

The disadvantage of using the second technique lies in varying the amplitude of the input signal prior to providing the signal to the amplifier gain stages. Where if the amplitude of the input signal falls below a minimum amplitude, or above a maximum amplitude, will result in the power amplifier output signal to also be distorted. The distortion is a result of the amplifier amplifying noise in the input signal when the input signal amplitude is below the minimum amplitude. Where as when the input signal is above the maximum amplitude the power amplifier gain stages respond in the non-linear region. Where the signal is above a maximum amplitude the amplifier operates close to the P1 dB point results in a similar problem of ACPR when used in RF applications.

In some cases, prior art circuits utilize a combination of varying the input signal amplitude and also the gain signal amplitude. Unfortunately, there are typically only a few gain signal amplitudes used for controlling the gain of the gain stages, and as a result when the gain is incrementally varied in amplitude, causing transistors within the gain stage to operate using another gain curve, amplified signal transients will be generated in the amplified output signal as a result of transitions from one gain curve to another during operation. Although this combination provides a form of dual variable gain control, it still compromises spectral linearity and power consumption efficiency for ease of control using a single control signal to vary the gain signal provided to the gain stages. Unfortunately, the aforementioned techniques suffer in that they do not provide maximum power amplifier dynamic range as well as offering decreased electrical power consumption by the power amplifier.

It is therefore an object of the invention to provide a method of adjusting gain and current consumption of a power amplifier such that the power amplifier operates within a linear gain region.

SUMMARY OF THE INVENTION

In accordance with the invention there is provided an amplifier comprising:

a first input port for receiving an input signal;

a second input port for receiving a control signal;

a signal power varying circuit for varying a power level. of the input signal in dependence upon the control signal to provide a signal for amplification;

an amplifying stage, having a small signal gain, coupled to the first input port for receiving the signal for amplification and for generating an amplified signal at an output port, the amplified signal being an amplified version of the signal for amplification;

a biasing circuit for receiving the control signal and for biasing the amplifying stage through a bias port using a bias signal, in dependence thereon, wherein, in use, the signal power varying circuit and the biasing circuit act in cooperation to provide a predetermined power profile for amplified signals and small signal gains.

In accordance with an aspect of the invention there is provided a method of controlling a power amplifier circuit for providing an amplified signal having an output power comprising the steps of:

providing a control signal;

providing an input signal having an input power to an input port of the power amplifier circuit;

adjusting in dependence upon the control signal a bias signal provided to the power amplifier circuit to vary the actual gain thereof;

attenuating the input power of the input signal in dependence upon the control signal to vary the input power of the input signal to the power amplifier to provide a predetermined power profile for amplified signals and small signal gains; and, amplifying the input signal to form the amplified signal.

In accordance with another aspect of the invention there is provided a method of calibrating a power amplifier circuit, for providing an amplified signal having an output power, comprising the steps of:

providing an input signal having a predetermined input power to an input port of the power amplifier circuit;

providing a mapping circuit;

providing an amplifier circuit, having a small signal gain and an actual gain, disposed within the power amplifier circuit;

measuring the output power of the amplified signal;

adjusting a control signal provided to the amplifier circuit to vary the actual gain thereof until a difference between the output power of the amplified signal and the small signal gain of the amplifier of is 1 dB or less; and, storing a relationship between control signal data, derived from the adjusted control signal, and bias signal data, derived from the bias signal, within the mapping circuit.

BRIEF DESCRIPTION OF THE DRAWINGS

The invention will be described with reference to the following diagrams, in which.

DETAILED DESCRIPTION OF THE INVENTION

Broadly, the invention comprises a method of adjusting gain and current consumption of a power amplifier, where the control signal and a variable amplitude input signal are used to determine a power amplifier operating point which yields optimal power consumption efficiency and maintaining spectral linearity.

Figure 1:
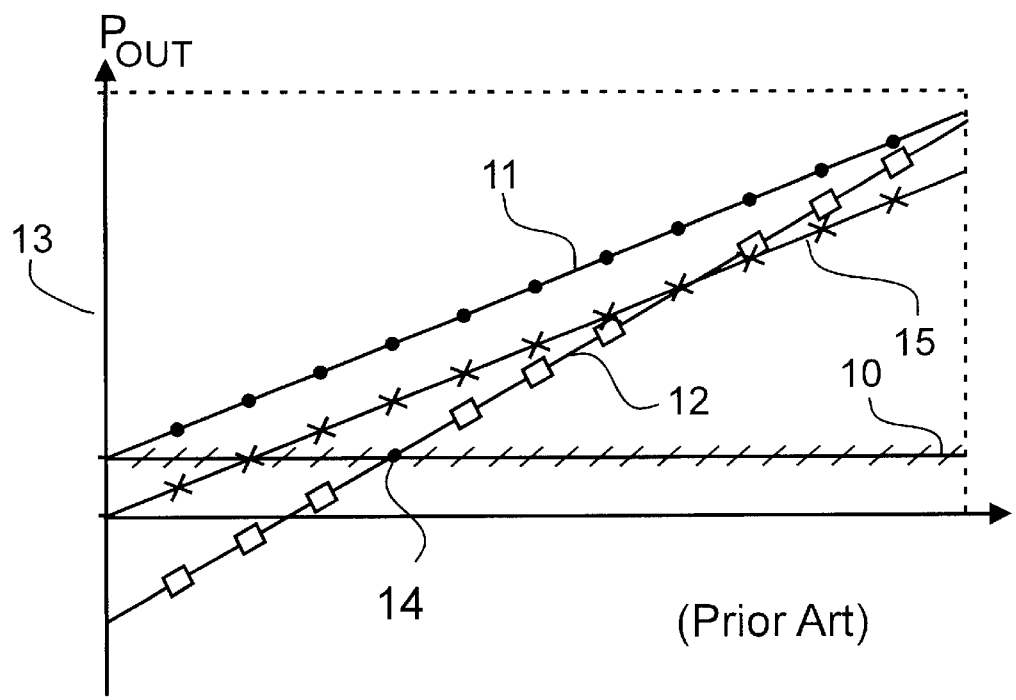
FIG. 1 illustrates operating characteristics of a typical prior art power amplifier.

Prior Art FIG. 1, illustrates a graph showing an amplified output signal with respect to a control signal providing a gain signal to the amplifier gain stages. The input power, $P_{in}$ 10, or amplitude of the input signal, is kept constant over a range of bias signal amplitudes 11. A P1 dB reference curve 12 is provided, as well as a Pout 13, output power, curve 11, and a gain curve 15. From this graph it is evident that there is a crossover point 14 where the P1 dB reference curve 12 is at a same output power level 13 as the power of the input signal 10. Where as the bias signal is reduced in amplitude the P1 dB reference curve drops faster than the gain curve, and as a result of having the input power constant, there will be a point where the P1 dB reference curve will be below the input signal power, at which point the power amplifier operates above the P1 dB reference and therefore fails ACPR requirement. Operating above the P1 dB reference point is not advantageous where spectral linearity is of concern.

Figure 2A:
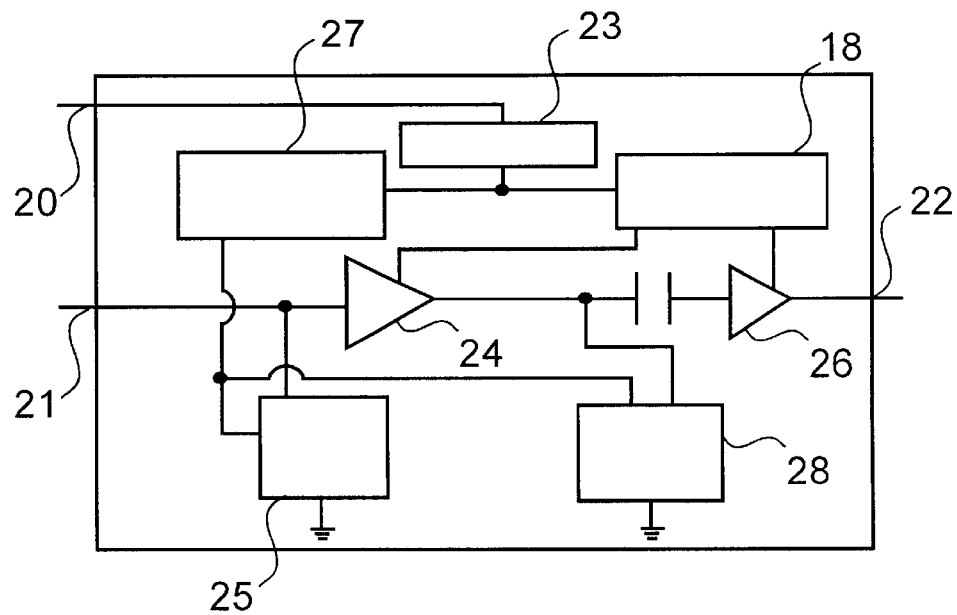
FIG. 2a is a schematic diagram of the present invention comprising an internal mapping circuit.
Figure 4:
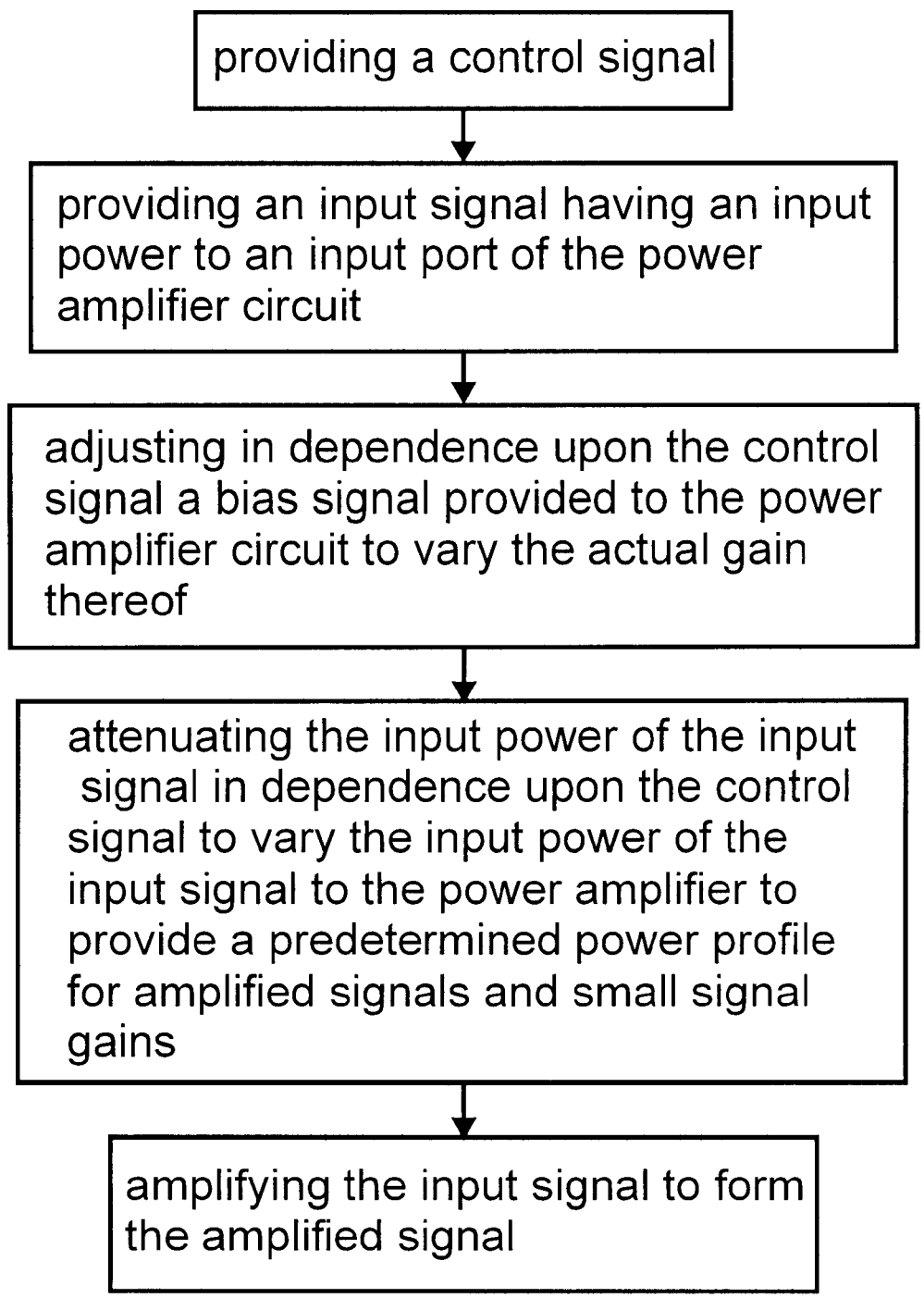
FIG. 4 illustrates steps taken in controlling a power amplifier circuit for providing an amplified signal.

FIG. 2a, illustrates a schematic diagram for a power amplifier circuit for accepting an input signal having a fixed amplitude and a control signal having varying amplitude. This power amplifier circuit has a control port 20 for receiving the control signal, a radio frequency (RF) input port 21 for receiving an RF input signal, and an RF output port 22 for providing an amplified output signal. A mapping circuit 23 is disposed within the power amplifier circuit to receive the control signal and to provide a mapping of a level of DC biasing and a level of RF signal shunting. A shunting control circuit 27 receives the level of RF signal shunting from the mapping circuit. FIG. 4, illustrates the power amplifier circuit operating steps, where, in use, the mapping signal is provided to a bias control circuit 18, where the bias control circuit provides a first bias signal to a first amplifier stage 24 and a second bias signal to a second amplifier stage 26, and where a shunting signal is provided to the input shunt circuit 25 as well as to an output shunt circuit 28 from the shunting control circuit 27, in a predetermined manner. The input shunt circuit 25 is coupled to the input port 21 for shunting a portion of the input signal to ground, decreasing an electrical RF power thereof. The output shunt circuit 28 shunts the RF signal after amplification by the first amplifier stage 24. The process of shunting the input signal results in a reduction in the input signal amplitude, proportional to the shunting signal, provided to the amplifier stage 24.

Figure 2B:
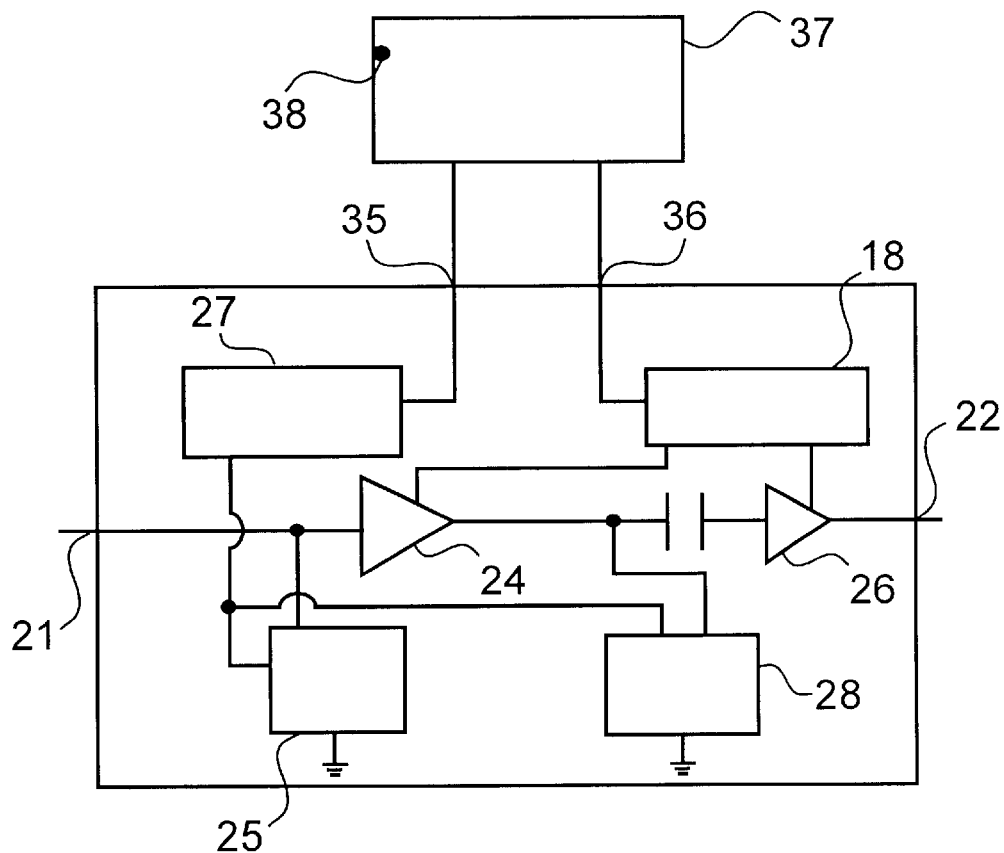
FIG. 2b is a schematic diagram of the present invention comprising an external mapping circuit.

FIG. 2b, illustrates a schematic diagram a power amplifier circuit for accepting an external shunting control signal and an external bias control signal. Both the external control signal and the external bias signals are variable in amplitude. An external mapping circuit 37 is provided for receiving a control signal through an external mapping control signal input port 38, where the external mapping circuit provides the external shunting control signal to the amplifier circuit via an external shunting input port 35, and provides the external bias control signal via an external bias input port 36 to the power amplifier circuit.

Figure 3:
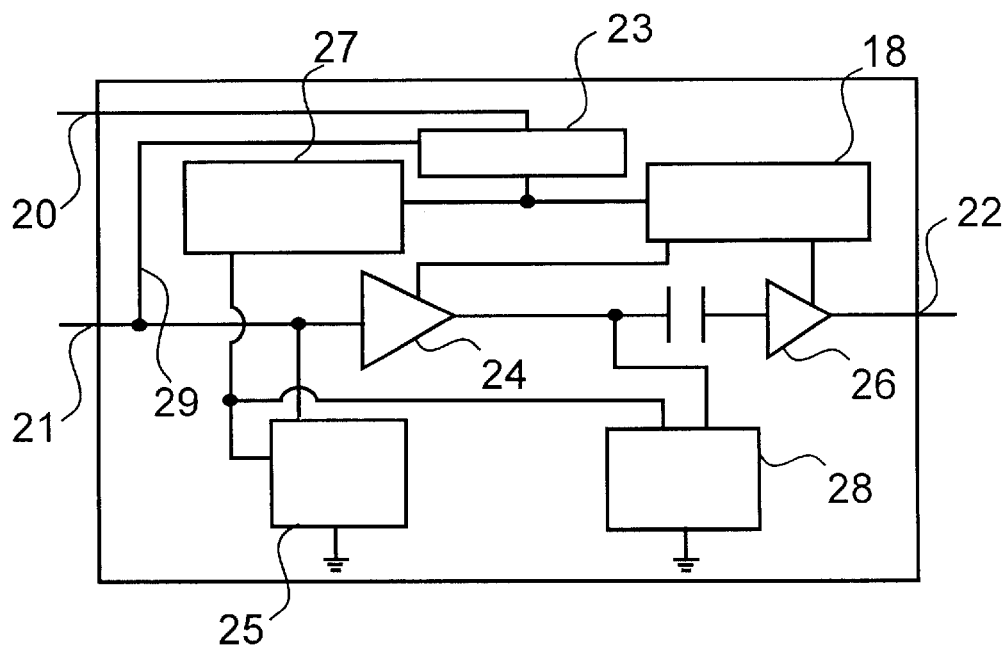
FIG. 3 is a schematic diagram of a variation on the present invention.

FIG. 3, illustrates a schematic diagram of a power amplifier circuit for accepting a variable input signal and a variable control signal. Both the control signal and the input signal are variable in amplitude. In order to use a variable input, an additional circuit path 29 is provided from the variable input to the mapping circuit. Where within the mapping circuit the amplitude of the input signal is measured and used in order to determine the mapping signal and the shunting signal. Where, in use, the mapping signal and the shunting signal are dependent upon the input signal amplitude and the control signal amplitude. The first and second bias signals, provided by the bias control circuit, control the amplification of the amplifier stages 24, 26 via the first and the second bias signals.

Figure 5:
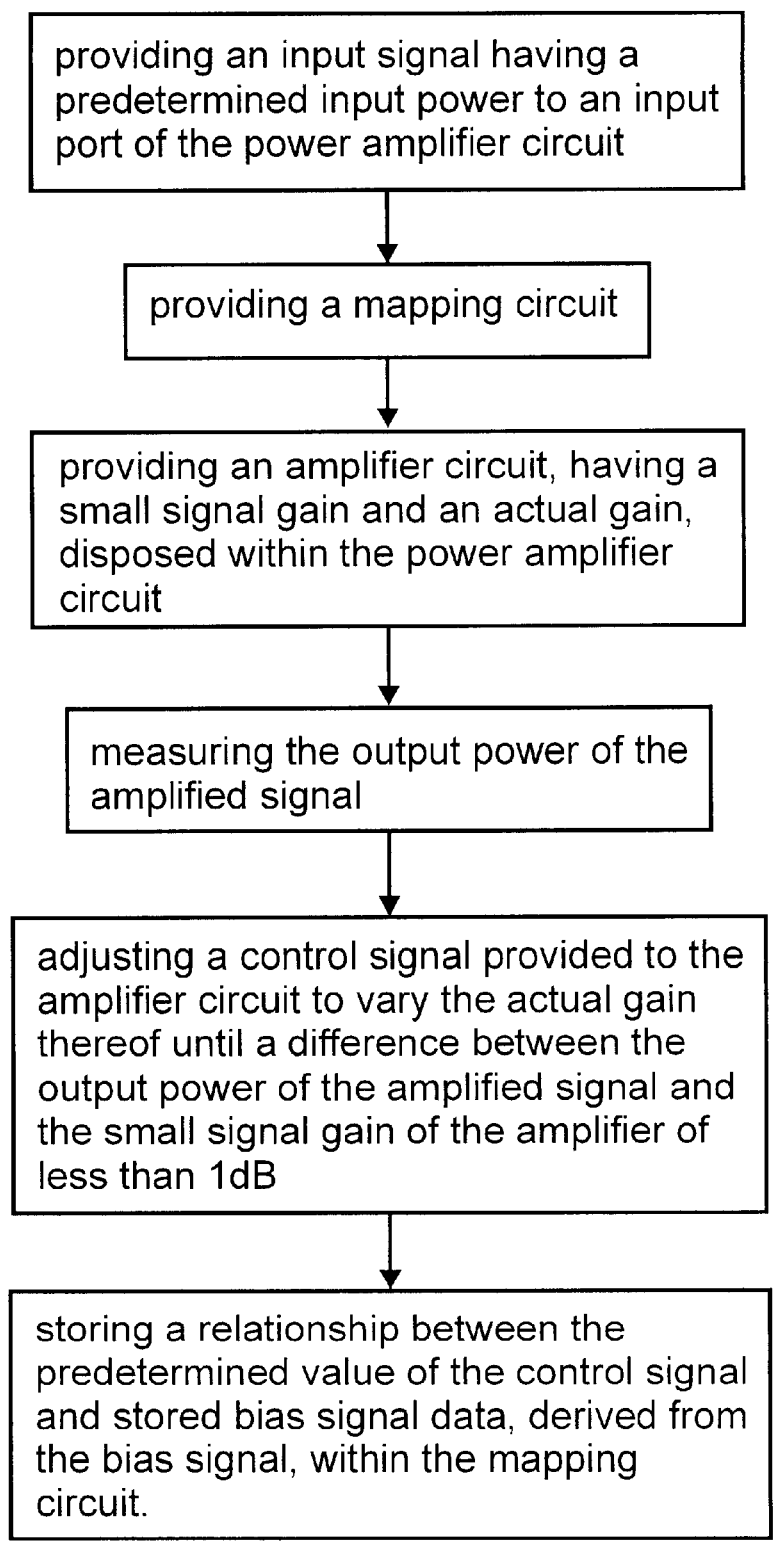
FIG. 5 illustrates steps taken in calibrating a power amplifier circuit for providing an amplified signal and, FIG. 6 is another embodiment of the invention wherein the amplifier and controller are each within different integrated circuit components.

In FIG. 5, steps used in calibrating the power amplifier circuit are shown. In a calibration mode the relationship between the control signal amplitude, as well as the RF input signal amplitude, is predetermined and stored within the mapping circuit, in relation to the bias signals. During calibration, the amplitude of the input signal is set to a predetermined value, after which the bias signals are applied to the amplification stages. The power consumption of the amplifier as well as amplifier operation below the P1 dB curve, above the P1 dB point 14, are verified. Once the power consumption is acceptable and the power amplifier is operating above P1 dB point, then the relationship between the control signal, input signal amplitude, and first and second bias signals are stored within the mapping circuit 23. For various input signal amplitude levels relationships between the control signal, input signal amplitude, and first and second bias signals are stored within the mapping circuit. In this manner, when an input signal having similar amplitude to that calibrated within the mapping circuit is provided to the input port, then the amplified output signal is above the P1 dB point and also offer adequate ACPR performance. Of course, if the input signal is fixed in amplitude and known, then measuring of the amplitude of the input signal is not necessary, and further storage of this value within the mapping circuit is not required either.

Figure 6:
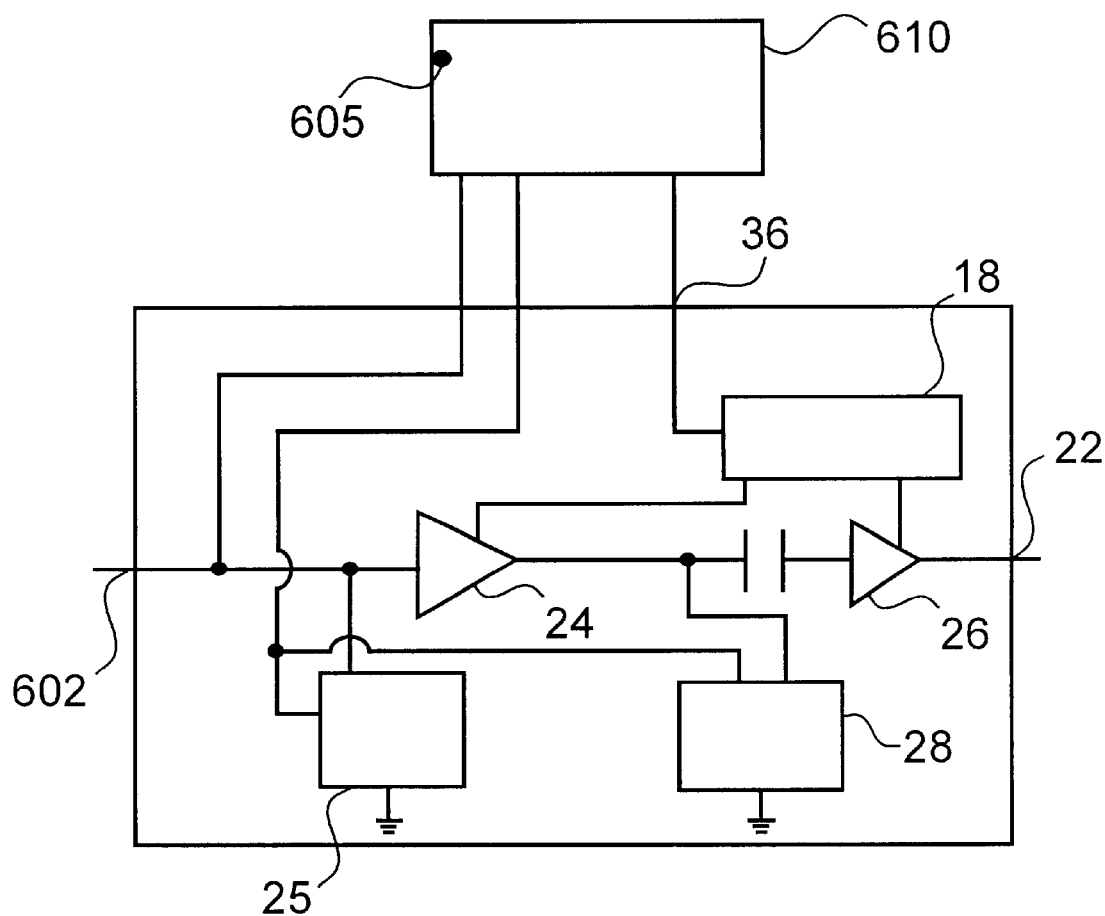

Referring to FIG. 6, another embodiment of the invention is shown. Here, an external mapping and shunting control circuit 610 is provided coupled to an input port 602 for receiving the input signal. The mapping and shunting control circuit 610 also receives at a further input port 605 a shunting control signal external to the device. Advantageously the external mapping and shunting circuit 610 provides the bias control signal and the shunting control signal. This allows an off the shelf look-up table component to be used with the invention.

Advantageously, this circuit amplifies the RF input signal in such a manner, that the amplified output signal conforms to the ACPR specification as well as providing power amplifier operation above the P1 dB point, thereby offering optimum output signal linearity. As a further advantage, because a relationship has been stored within the mapping circuit between input signal power and gain signals, only the control signal is required to control the gain of the power amplifier circuit. Therefore this power amplifier circuit provides ease of use when coupled to conventional circuits requiring highly linear amplification of the input signal. The circuit also advantageously provides a large savings in power consumption since the bias signals are reduced in amplitude for an output signal requiring lower amplification. Shunts within the circuit are static and therefore require minimal power consumption. As a further power consumption advantage, a large power savings is realized by the amplifier circuit for amplified output signal amplitudes that are low.

When manufacturing of the power amplifier circuit using integrated circuit processes, manufacturing tolerances can be relaxed since the power amplifier circuit provides the mapping circuit. The mapping circuit is used to calibrate the power amplifier behavior and is specific to each device. Where if there are some manufacturing irregularities than can be calibrated within the power amplifier providing an advantage of offering reliable precalibrated power amplifier performance, thereby offering relaxed manufacturing tolerances. Advantageously, by providing a mapping circuit the power consumption efficiency of the circuit is increased as well as spectral linearity.

Numerous other embodiments may be envisaged without departing from the spirit or scope of the invention.

What is claimed is:

1. An amplifier comprising:
   a first input port for receiving a signal for amplification;
   a second input port for receiving a control signal;
   a first amplifying stage, having a first gain and a first small signal gain, coupled to the first input port for receiving the signal for amplification and for generating a first amplified signal at an output port, the first amplified signal being an amplified version of the signal for amplification;
   at least a shunting circuit for varying a signal power level of at least one of the input signal and the first amplified signal in dependence upon the control signal; and,
   a biasing circuit for receiving the control signal and for variably biasing the first amplifying stage in dependence upon a bias signal received through a bias port,
   wherein, in use, the shunting circuit and the biasing circuit act in cooperation to provide any of a plurality of predetermined power profiles for the first amplified signal and the first small signal gain.

2. An amplifier according to claim 1, wherein a predetermined power profile from the plurality of predetermined power profiles for the first amplified signal and the first small signal gain is such that the gain of the amplified signal and the first small signal gain of the first amplifying stage is maintained at 1 dB or less.

3. An amplifier according to claim 1, wherein the at least a shunting circuit comprises a first shunting circuit disposed for varying the power level of the input signal in dependence upon the control signal.

4. An amplifier according to claim 3, wherein the at least a shunting circuit comprises a second shunting circuit disposed for varying the power level of the first amplified signal in dependence upon the control signal.

5. An amplifier according to claim 1, comprising:
   a mapping circuit for receiving the control signal and for mapping the received control signal onto a bias signal space to provide the bias signal for biasing the first amplifying stage in dependence thereon.

6. An amplifier according to claim 5, wherein the mapping circuit comprises a lookup table.

7. An amplifier according to claim 6, wherein the lookup table is for storing a relationship between at least two of input signal data derived from the input signal and control signal data derived from the control signal and bias control data derived from the bias signal used to control the first amplifying stage.

8. An amplifier according to claim 6, wherein the lookup table is stored in non-volatile memory within the mapping circuit.

9. An amplifier according to claim 3, comprising a mapping circuit, wherein the mapping circuit includes a port for receiving the input signal, where the first shunting circuit is controlled in dependence upon the control signal and the input signal, wherein the input signal is variable in signal power and the first shunting circuit is for varying the signal power of this input signal to maintain the first amplifying stage in operation such that the difference between the gain of the amplified signal and the small signal gain of the first amplifying stage is maintained at 1 dB or less.

10. A method of controlling a power amplifier circuit for providing an amplified signal having an output power comprising the steps of:
   providing a control signal;
   providing an input signal having an input power to an input port of the power amplifier circuit;
   adjusting in dependence upon the control signal a bias signal provided to the power amplifier circuit to vary the actual gain thereof;

amplifying the input signal to form the amplified signal:
  shunting signal power from at least one of the input signal and the amplified signal in dependence upon the control signal to vary at least one of the input power of the input signal provided to the power amplifier and amplified signal power of the amplified signal provided from the power amplifier, the steps of shunting and adjusting resulting in one of a plurality of predetermined power profiles each supported by the power amplifier circuit for an amplified signal and small signal gain.

11. A method according to claim 10, wherein the predetermined power profile for amplified signals and small signal gains is such as to maintain a difference between the gain of the amplified signal and a small signal gain of the power amplifier circuit of 1 dB or less.

12. A method of adjusting amplification of a power amplifier circuit according to claim 10, wherein the input power of the input signal is fixed in power prior to being shunted.

13. A method of adjusting amplification of a power amplifier circuit according to claim 12, comprising the steps of:
  measuring a property of the control signal;
  retrieving a value from a memory location corresponding to the measured property of the control signal; and,
  providing the bias signal to the power amplifier circuit based on the value retrieved from the memory location.

14. A method of adjusting amplification of a power amplifier circuit according to claim 10, wherein the control signal is a digital control signal.

15. A method of adjusting amplification of a power amplifier circuit according to claim 10, wherein the control signal is an analog control signal.

16. A method of adjusting amplification of a power amplifier circuit according to claim 10, wherein the input power of the input signal is variable in power.

17. A method of adjusting amplification of a power amplifier circuit according to claim 16, comprising the steps of:
  measuring a property of the input signal; and,
  wherein the step of shunting the input power of the input signal is additionally dependent upon the measured property of the input signal.

18. A method of adjusting amplification of a power amplifier circuit according to claim 16, comprising the steps of:
  measuring a property of the control signal;
  measuring a property of the input signal;
  retrieving a value from a memory location corresponding to the measured property of the
  control signal and to the measured property of the input signal; and,
  wherein the bias signal provided to the power amplifier circuit is based on the value retrieved from the memory location.

19. A method of adjusting amplification of a power amplifier circuit according to claim 10, comprising the steps of:
  measuring a property of the input signal;
  shunting the input signal in dependence upon the measured property; and,
  wherein the step of adjusting further comprises the step of adjusting the bias signal provided to the amplifier circuit based on the measure property of the input signal.

20. A method of calibrating a power amplifier circuit, for providing an amplified signal having an output power, comprising the steps of:
  providing an input signal having a predetermined input power to an input port of the power amplifier circuit;
  providing a mapping circuit;
  providing an amplifier circuit, having a small signal gain and an actual gain, disposed within the power amplifier circuit;
  measuring the output power of the amplified signal;
  adjusting a control signal provided to the amplifier circuit to vary the actual gain thereof until a difference between the actual gain of the amplified signal and the small signal gain or the amplifier of is 1 dB or less; and,
  storing a relationship between control signal data, derived from the adjusted control signal, and bias signal data, derived from the bias signal, within the mapping circuit.

21. A method of calibrating a power amplifier circuit according to claim 20, comprising the steps of:
  additionally providing the control signal to an input port of the mapping circuit; and,
  where the step of storing the relationship additionally comprises storing a relationship with respect to the predetermined input power of the input signal.

22. A method of calibrating a power amplifier circuit according to claim 20, wherein the control signal is a digital control signal.

23. A method of calibrating a power amplifier circuit according to claim 20, wherein the control signal is an analog control signal.

24. An amplifier according to claim 1, comprising:
  a second amplifying stage having a second gain and a second small signal gain for receiving the first amplified signal and for generating an amplified signal, the amplified signal being an amplified version of the first amplified signal.

25. An amplifier according to claim 24, comprising a mapping circuit, wherein the mapping circuit includes a port for receiving the input signal, where the second shunting circuit is controlled in dependence upon the control signal and the input signal, wherein the input signal is variable in signal power and the second shunting circuit is for varying the signal power of the input signal to maintain the second amplifying stage in operation such that the difference between the gain of the amplified signal and the small signal gain of the second amplifying stage is maintained at 1 dB or less.

26. An amplifier according to claim 1, wherein the at least a shunting circuit comprises a second shunting circuit disposed for varying the power level of the first amplified signal in dependence upon the control signal.

27. An amplifier comprising:
  a first input port for receiving a signal for amplification;
  a second input port for receiving a control signal;

a first amplifying stage, having a first gain and a first small signal gain, coupled to the first input port for receiving the signal for amplification and for generating a first amplified signal at an output port, the first amplified signal being an amplified version of the signal for amplification;

at least a signal power varying circuit for varying a signal power level of at least one of the input signal and the first amplified signal in dependence upon the control signal; and, a biasing circuit for receiving the control signal and for variably biasing the first amplifying stage in dependence upon a bias signal received through a bias port;

wherein, in use, the signal power varying circuit and the biasing circuit act in cooperation to provide any of a plurality of predetermined power profiles for the first amplified signal and the first small signal gain.

* * * * *